United States Patent [19]
Zhao et al.

[11] Patent Number: 5,942,592
[45] Date of Patent: Aug. 24, 1999

[54] SILOXANE POLYIMIDE AND HEAT-RESISTANT ADHESIVE CONTAINING THE SAME

[75] Inventors: Dong Zhao; Hiroshi Sakuyama, both of Kitaibaraki; Tomoko Katono, Iwaki; Lin-chiu Chiang; Jeng-Tain Lin, both of Kitaibaraki, all of Japan

[73] Assignee: Nippon Mektron, Limited, Tokyo, Japan

[21] Appl. No.: 09/018,063

[22] Filed: Feb. 3, 1998

[30] Foreign Application Priority Data

Feb. 5, 1997 [JP] Japan .................................. 9-035736

[51] Int. Cl.$^6$ .................................................... C08G 77/26
[52] U.S. Cl. ........................... 528/26; 525/430; 525/431; 525/476; 528/28; 528/38
[58] Field of Search ................................ 528/26, 28, 38; 525/430, 431, 476

[56] References Cited

U.S. PATENT DOCUMENTS 5,859,181  1/1999  Zhao et al. .............................. 528/353

FOREIGN PATENT DOCUMENTS

A 61-118424  6/1986  Japan .
A 1-121325   5/1989  Japan .

*Primary Examiner*—Margaret W. Glass Moore
*Attorney, Agent, or Firm*—Barnes & Thornburg

[57] ABSTRACT

A solvent-soluble siloxane polyimide comprising a copolymer obtained by reaction of a diamine compound mixture comprising a diaminopolysiloxane, an alicyclic diamine and an aromatic diamine with an aromatic tetracarboxylic acid anhydride, followed by polyimidization reaction of the resulting polyamic acid forms a heat-resistant adhesive by adding an epoxy resin, a diamine-based curing agent and an organic solvent thereto, The formed adhesives provides a distinguished curling resistance without any warp when the resulting siloxane polyimide soluble in ordinary organic solvents is used as a main component of the adhesive for bonding between a base material and a copper foil of a flexible printed substrate.

11 Claims, No Drawings

SILOXANE POLYIMIDE AND HEAT-RESISTANT ADHESIVE CONTAINING THE SAME

BACKGROUND OF THE INVENTION

1. Field of the Invention

The present invention relates to a siloxane polyimide and a heat-resistant adhesive containing the same, and more particularly to a solvent-soluble siloxane polyimide and heat-resistant adhesive containing the same.

2. Description of Related Art

Heat-resistant adhesives containing an aromatic polyimide, etc. as a main component have been so far used in bonding between a base material and a copper foil of a flexible printed substrate. However, the aromatic polyimide is generally insoluble in ordinary organic solvents, and thus is used in the form of a solution of an aromatic polyamic acid as its precursor, which specifically requires an additional polyimidization reaction step with heating at a high temperature for a long time in stage B of evaporating coating solution and ring closure reaction for polyimidization. The polyimidization reaction step has such problems as occurrence of void phenomena and thermal deterioration of electronic parts per se.

JP-A-61-118424, JP-A-1-121325, etc. on the other hand, disclose solvent-soluble siloxane polyimides, but have such problems as low heat resistance, insufficient solubility in a variety of organic solvents, considerable curling of substrates when drying solution-applied flexible printed substrates, etc.

SUMMARY OF THE INVENTION

An object of the present invention is to provide a siloxane polyimide soluble in ordinary organic solvents, which has a distinguished curling resistance without any warp when used as a main component of an adhesive for bonding between a base material and a copper foil of a flexible printed substrate.

A solvent-soluble siloxane polyimide according to the present invention comprises a copolymer of diamine compound mixture comprising a diaminopolysiloxane, an alicyclic diamine and an aromatic diamine with an aromatic tetracarboxylic acid dianhydride.

DETAILED DESCRIPTION OF THE INVENTION

For a diaminopolysiloxane, which is one component of three kinds of the diamine compound mixture reactive with an aromatic tetracarboxylic acid dianhydride, a compound represented by the following general formula can be used:

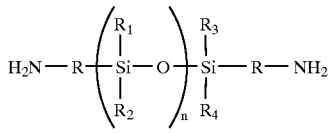

where R respresents a divalent hydrocarbon group having 2 to 6 carbon atoms, preferably 3 to 5 carbon atoms; $R_1$ to $R_4$ each independently represent a lower alkyl group having 1 to 5 carbon atoms and a phenyl group; and n represents an integer of 0 to 30, preferably 4 to 12.

The compound includes, for example, compounds having R and $R_1$ to $R_4$ in the following combinations:

| R | $R_1$ | $R_2$ | $R_3$ | $R_4$ |
|---|---|---|---|---|
| $(CH_2)_3$ | $CH_3$ | $CH_3$ | $CH_3$ | $CH_3$ |
| $(CH_2)_4$ | $CH_3$ | $CH_3$ | $CH_3$ | $CH_3$ |
| $(CH_2)_3$ | $CH_3$ | $C_6H_5$ | $CH_3$ | $C_6H_5$ |
| $p-C_6H_4$ | $CH_3$ | $CH_3$ | $CH_3$ | $CH_3$ |

In practice, such commercially available products as TSL9386, TSL9346 and TSL9306 (products available from Toshiba Silicone K.K., Japan), BY16-853U (product available from Toray-Dow Corning K.K., Japan), X-22-161AS (product available from Shinetsu Kagaku Kogyo K. K., Japan), F2-053-01 (product available from Nihon Unicar K.K., Japan), etc. can be used.

For an alicyclic diamine, which is a second component of the diamine compound mixture, diamines having at least one cyclohexane ring, for example, 1,3-bis(aminomethyl)cyclohexane, 1,4-bis(aminomethyl)cyclohexane, 1,3-diaminocyclohexane, etc. can be used alone or in mixture.

For an aromatic diamine, which is a third component of the diamine compound, well known aromatic diamines used in such a polyimidization reaction, for example, 4,4'-diaminodiphenylsulfone, 3,4'-diaminodiphenylsulfone, 4,4'-diaminodiphenylether, 4,4'-diaminodiphenylsulfide, 1,3'-bis(4-aminophenoxy)-benzene, 1,4'-bis(4-aminophenoxy)benzene, 4,4'-bis(4-aminophenoxy)biphenyl, 2,2'-bis[4-(4-aminophenoxy)phenyl]hexafluoropropane, 4,4'-diamino-4"-hydroxytriphenylmethane, 4,4'-diaminodiphenylmethane, etc. can be used alone or in mixtures thereof.

Among these three kinds of diamine compounds, the diaminopolysiloxane can be used in a proportion of about 10 to about 85% by mole, preferably about 40 to about 60% by mole; the alicyclic diamine in a proportion of about 10 to about 85% by mole, preferably about 20 to about 60% by mole; and the aromatic diamine in a proportion of about 0.1 to about 30% by mole, preferably about 1 to about 15% by mole. When the proportion of the alicylic diamine is lower than about 10% by mole, solubility in ordinary organic solvents will be lowered or even to zero (insoluble).

For an aromatic tetracarboxylic acid dianhydride reactive with the diamine compound mixture, 3,3',4,4'-benzophenonetetracarboxylic acid dianhydride, 3,3',4,4'-diphenylsulfonetetracarboxylic acid dianhydride, 4,4'-oxydiphthalic acid dianhydride, 4,4'-biphthalic acid dianhydride, 2,2'-diphthalic acid dianhydride propane, diphthalic acid dianhydride methane, pyromellitic acid dianhydride, 2,2'-(hexafluoroisopropylidene) diphthalic acid dianhydride, etc. can be used in an equimolar amount to the diamine compound mixture.

Reaction of the diamine compound mixture with the aromatic tetracarboxylic acid dianhydride is carried out preferably in an aprotic polar solvent such as dimethylformamide, dimethylacetamide, N-methylpyrrolidone, etc., or also in a polar solvent such as cresol, pyridine, etc. In practice, the reaction is carried out by dropwise addition of the diamine compound mixture to a polar solvent solution of the aromatic tetracarboxylic acid dianhydride at a temperature of about 0° to 10° C.

The reaction product is a polyamic acid as a polyimide precursor, and thus is to be subjected to dehydration reaction for polyimidizing the polyamic acid. Dehydration reaction is carried out at a temperature of about 100° to about 200° C., preferably using a dehydrating agent such as acetic anhydride, etc.

Siloxane polyimide as a polyimidization reaction product seems to be a block copolymer having repeating units (a), (b) and (c) represented by the following general formulae and having a weight average molecular weight Mw of about 10,000 to about 100,000, preferably about 25,000 to about 75,000 (as determined by GPC and in terms of polystyrene):

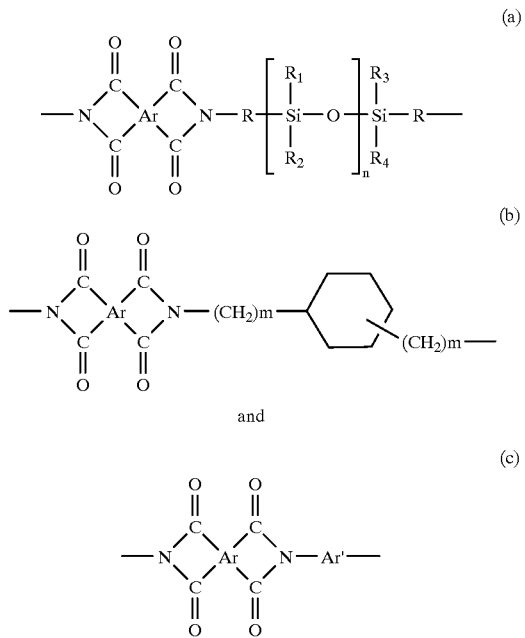

where Ar represents an aromatic tetracarboxylic acid residue; Ar' represents an aromatic diamine residue; R represents a divalent hydrocarbon group having 2 to 6 carbon atoms, preferably 3 to 5 carbon atoms; $R_1$ to $R_4$ each independently represents a lower alkyl group having 1 to 5 carbon atoms or a phenyl group, n represents an integer of 0 to 30, preferably 4 to 12; and m represents 0 or 1.

The resulting siloxane polyimide can be formed into a heat-resistant adhesive by adding an epoxy resin, a diamine-based curing agent and an organic solvent thereto.

For an epoxy resin, any of bisphenol A type, biphenyl type, glycidylamine type, novolak type, etc. can be used. In practice, commercially available epoxy resins, such as Epikote 154, 604, 871, 828, etc. (products available from Yuka-Shell K. K., Japan) can be used. About 0.1 to about 30 parts by weight, preferably about 0.1 to about 10 parts by weight, of the epoxy resin is used on the basis of 100 parts by weight of the siloxane polyimide. When the epoxy resin is used in an amount of less than about 0.1 parts by weight, the adhesiveness to a flexible printed substrate film will be lowered, whereas when it is used in an amount of more than about 30 parts by weight the heat resistance will be lowered.

The diamine-based curing agent is used to cure the epoxy resin, and about 0.1 to about 30 parts by weight, preferably about 0.1 to about 10 parts by weight of the diamine-based curing agent such as 4,4'-diaminodiphenylsulfone, 4,4'-diaminodiphenylmethane, m-phenylenediamine, m-xylylenediamine, isophoronediamine, diethylenetriamine, triethylenetetramine, etc. can be used on the basis of 100 parts by weight of the siloxane polyimide.

The foregoing epoxy resin and diamine-based curing agent are dissolved in an ordinary, low boiling point organic solvent such as methyl ethyl ketone, chloroform, tetrahydrofuran, toluene, etc. at a solid concentration of about 10 to about 50% by weight, preferably about 20 to about 40% by weight to make a solution of adhesive composition.

The solution of adhesive composition so prepared can be effectively used for bonding between a base material and a copper foil of a flexible printed substrate. In practice, the solution is applied to a flexible base material such as a polyimide film, etc., followed by drying at about 140° C. for about 5 minutes and a copper foil as a constituent member of a printed wiring is then laid thereon, followed by curing at about 180° C. for about 12 hours after preheating at about 185° C. for 30 seconds, whereby effective bonding can be obtained.

An adhesive containing a novel siloxane polyimide according to the present invention as an effective adhesive component can improve the sparingly solubility and a high temperature process ability as disadvantages of polyimide resin and also shows a distinguished effect of heat-resistant adhesion. Flexible printed substrates, with effective adhesion between the substrate and the copper foil by using the present heat-resistant adhesive present no such phenomena as large substrate curling.

PREFERRED EMBODIMENTS OF THE INVENTION

The present invention will be described in detail below, referring to Examples.

EXAMPLE 1

Into a separable flask having a capacity of 100 ml were charged 1.70 g (5 m moles) of 3,3',4,4'-benzophenonetetracarboxylic acid dianhydride and 15 ml of N-methylpyrolidone in a nitrogen gas atmosphere, followed by ice cooling. Then, a mixture consisting of 2. 20 g (2.5 m moles) of diaminopolysiloxane [BY16-853U, trademark of a product available from Toray-Dow Corning K.K., Japan; R of the foregoing general formula is a $(CH_2)_3$ group; $R_1$ to $R_4$ thereof each are a $CH_3$ group], 0.22 g (1.5 m moles) of 1,3-bis (aminomethyl)cyclohexane and 0.26 g (1 m mole) of 4,4'-diaminodiphenylsulfone was dropwise added thereto. After completion of the dropwise addition, the mixture was stirred at room temperature for 30 minutes to dissolve the undissolved matters. Then, dehydration reaction was carried out by stirring at 50° C. for 3 hours and then at 200° C. for 3 hours. After completion of the reaction, the reaction mixture was reprecipitated in distilled water, whereby siloxane polyimide having a weight average molecular weight Mw of 39,000 was obtained.

To 100 parts by weight of siloxane polyimide so obtained were added one part by weight of bisphenol A type epoxy resin (epoxy equivalent: 110-130), one part by weight of 4,4'-diaminodiphenyl-sulfone curing agent and methyl ethyl ketone to prepare a methyl ethyl ketone solution having a solid concentration of 30% by weight. The solution so obtained was applied to a polyimide film (Capton film, product available from DuPont Co. Inc), dried at 140° C. for 5 minutes and preheated at 185° C. for 30 minutes. Then, a copper foil was laid thereon by pressing at a gauge pressure of 37 kg/cm² for 70 seconds and curing at 180° C. for 12 hours.

Adhesive tensile strength at room temperature and that at 150° C. of the adhesion product were measured and found to be 0.89 kg/cm and 0.75 kg/cm, respectively. Curling resistance (resistance to large curling of a flexible printed substrate by an effective adhesion between the substrate and the copper foil) was also found good.

EXAMPLE 2

In Example 1, 3.21 g (4 m moles) of Toshiba Silicone Product TSL938[R of the foregoing formula is a $(CH_2)_3$ group; $R_1$ to $R_4$ thereof each are a $CH_3$ group] was used and 0.15 g (0.5 m moles) of 4,4'-diamino-4"-hydroxytriphenylmethane was used in place of 4,4'-diaminodiphenylsulfone and the amount of 1,3-bis(aminomethyl)cyclohexane was changed to 0.07 g (0.5 m moles). The reaction was carried out in the same manner as in Example 1, whereby siloxane polyimide having a Mw of 72,000 was obtained.

Adhesion of a polyimide film as used in Example 1 to a copper foil using the siloxane polyimide solution so obtained was carried out, and adhesive tensile strength at room temperature and that at 150° C. of the adhesion product were measured and found to be 0.83 kg/cm and 0.56 kg/cm, respectively, with good curling resistances.

EXAMPLE 3

In Example 1, Epicoat 154 (epoxy equivalent: 176-180) was used as bisphenol A type epoxy resin and the amount of the curing agent was changed to 5 parts by weight. Adhesion of a polyimide film as used in Example 1 to a copper foil using the siloxane polyimide solution so obtained was carried out, and adhesive tensile strength at room temperature and that at 150° C. of the adhesion product were measured and found to be 1.09 kg/cm and 0.68 kg/cm, respectively, with good curling resistance.

EXAMPLE 4

In Example 2, Epicoat 154 was used as bisphenol A type epoxy resin and the amount of the curing agent was changed to 5 parts by weight. Adhesion of a polyimide film as used in Example 1 to a copper foil using the siloxane polyimide solution so obtained was carried out, and adhesive tensile strength at room temperature and that at 150° C. were measured and found to be 0.79 kg/cm and 0.61 kg/cm, respectively, with good curling resistance.

What is claimed is:

1. A solvent-soluble siloxane polyimide, which comprises a block copolymer having repeating units (a), (b) and (c) represented by the following general formulae:

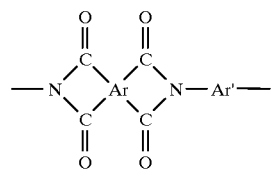
(a)

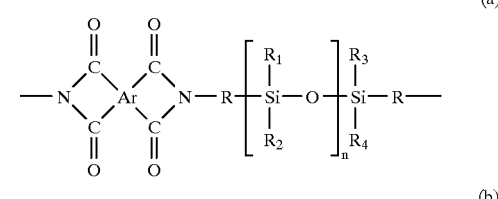
(b)

and

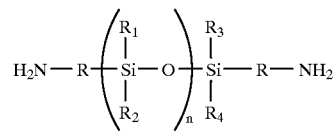
(c)

where Ar represents an aromatic tetracarboxylic acid residue; Ar' represents an aromatic diamine residue; R represents a divalent hydrocarbon group having 2 to 6 carbon atoms; $R_1$ to $R_4$ each independently represent a lower alkyl group having 1 to 5 carbon atoms or a phenyl group; n is an integer of 0 to 30; and m represents 0 or 1.

2. A process for producing a solvent-soluble siloxane polyimide, which comprises allowing a diamine compound mixture comprising a diaminopolysiloxane, an alicyclic diamine and an aromatic diamine to react with an aromatic tetracarboxylic acid dianhydride in an equimolar amount and polyimidizing the resulting polyamic acid.

3. A process according to claim 2, wherein the diaminopolysiloxane is represented by the following general formula:

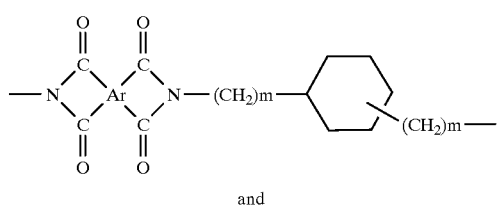

wherein R represents a divalent hydrocarbon group having 2 to 6 carbon atoms; $R_1$ to $R_4$ each independently represent a lower alkyl group having 1 to 5 carbon atoms or a phenyl group; and n is an integer of 0 to 30.

4. A process according to claim 2, wherein the alicyclic diamine is a diamine having at least one cyclohexane ring.

5. A process according to claim 4, wherein the diamine containing at least one cyclohexane ring is 1,3-bis-(aminomethyl)cyclohexane, 1,4-bis(aminomethyl)cyclohexane or 1,3-diaminocyclohexane.

6. A proces according to claim 2, wherein the diamine compound mixture consists of about 10 to about 85% by mole of diaminopolysiloxane, about 10 to about 85% by mole of alicyclic diamine and about 0.1 to about 30% by mole of aromatic diamine, sum total being 100% by mole.

7. A process according to claim 2, wherein the diamine compound mixture consistes of about 40 to about 60% by mole of diaminosiloxane, about 20 to about 60% by mole of alicyclic diamine and about 1 to about 15% by mole of aromatic diamine, sum total being 100% by mole.

8. A heat-resistant adhesive, which comprises a siloxane polyimide comprising a block copolymer having repeating units (a), (b) and (c) represented by the following general formulae:

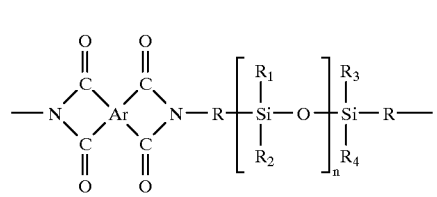
(a)

-continued (b)
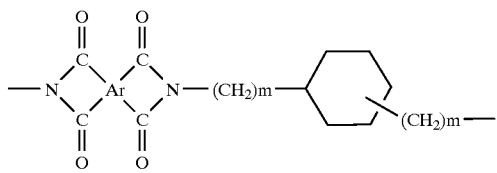

and (c)
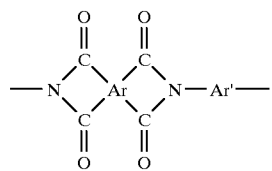

where Ar represents an aromatic tetracarboxylic acid residue; Ar' represents an aromatic diamine residue; R represents a divalent hydrocarbon group having 2 to 6 caron atoms; $R_1$ to $R_4$ each independently represent a lower alkyl group having 1 to 5 carbon atoms or a phenyl group; n represents an integer of 0 to 30; and m represents 0 or 1, an epoxy resin, a diamine-based curing agent and an organic solvent.

9. A heat-resistant adhesive according to claim 8, wherein about 0.1 to about 30% by weight of the epoxy resin is used on the basis of the siloxane polyimide.

10. A heat-resistant adhesive according to claim 8, wherein about 0.1 to about 30% by weight of the diamine-based curing agent is used on the basis of the siloxane polyimide.

11. A heat-resistant adhesive according to claim 8, wherein the adhesive is used for bonding between a base material and a copper foil of a flexible printed substrate.

* * * * *